United States Patent
Park et al.

[19]

[11] Patent Number: 5,999,479
[45] Date of Patent: Dec. 7, 1999

[54] ROW DECODER FOR NONVOLATILE MEMORY HAVING A LOW-VOLTAGE POWER SUPPLY

[75] Inventors: Eungjoon Park; Hsi-Hsien Hung, both of Fremont, Calif.

[73] Assignee: Integrated Silicon Solution, Inc., Santa Clara, Calif.

[21] Appl. No.: 09/010,202

[22] Filed: Jan. 21, 1998

[51] Int. Cl.[6] .................................................. G11C 8/00
[52] U.S. Cl. .............................. 365/230.06; 365/189.01; 365/230.05
[58] Field of Search ..................... 365/230.06, 230.03, 365/189.01, 189.09, 230.05

[56] References Cited

U.S. PATENT DOCUMENTS 5,278,802  1/1994  Kersh, III et al. ................. 365/230.06
5,732,040  3/1998  Yabe ................................. 365/230.03

OTHER PUBLICATIONS

Johnny C. Chen, T.H. Kuo, Lee E. Cleveland, Chung K. Chung, Nancy Leong, Yong K. Kim, Takao Akaogi, Yasushi Kasa, "A 2.7V only 8Mbx16 NOR Flash Memory" 1996 IEEE Symposium on VLSI Circuits Digest of Technical Papers, pp. 172–173.

*Primary Examiner*—David Nelms
*Assistant Examiner*—David Lam
*Attorney, Agent, or Firm*—Pennie & Edmonds LLP

[57] ABSTRACT

A row decoder for a nonvolatile memory having a low-voltage power supply that minimizes the load capacitance presented to a high voltage source without requiring additional circuitry. The row decoder accomplishes this by providing a local decoder having only one input requiring a boosted voltage higher than the power supply voltage. Further, predecoders are used to reduce the number of local decoders that receive the boosted voltage.

5 Claims, 5 Drawing Sheets

Local Decoder

ROW DECODER FOR NONVOLATILE MEMORY HAVING A LOW-VOLTAGE POWER SUPPLY

The present invention relates generally to nonvolatile semiconductor memory devices, and more particularly to a row decoder for a nonvolatile memory having a low-voltage power supply that minimizes the load capacitance presented to a high voltage source.

BACKGROUND OF THE INVENTION

Nonvolatile semiconductor memory devices are well-known in the art. These devices include the erasable-programmable read-only memory (EPROM), the electrically-erasable-programmable read-only memory (EEPROM), and most recently, the flash memory. Flash memories are widely used for nonvolatile memory applications because they combine several of the most desirable characteristics of EPROMs and EEPROMs, including electrical erasability and erasability on a global or sector basis.

FIG. 1 is a block diagram of a flash memory 110. This block diagram is also representative of the architecture of other types of memories. The flash memory 110 includes a memory array 112, and address row decoder 114, a control circuit 116, an input/output (I/O) data circuit 118 and a column I/O circuitry 120. Memory 110 operates in response to external signals provided by a controlling device 122, such as a microprocessor.

The principle of operation of flash memories, such as memory 110, is well known and therefore is only briefly described herein. Controller 122 initiates a memory operation by asserting chip enables 101 and supplying address signals $A_0$–$A_N$ (corresponding to $2^{N+1}$ memory locations) designating the address of a memory location where the operation is to be performed. If the memory operation is a write or program operation, controller 122 supplies the data to be written to the addressed memory location via the bi-directional input/output lines $I/O_O$–$I/O_K$ (corresponding to a K+1 bit wide memory word). If the memory operation is a read operation, the stored information from the addressed location is read out from the same bi-directional input/output lines $I/O_O$–$I/O_K$. Memory 110 also provides connections for external power supply ($V_{cc}$) and ground (GND) signals.

The heart of memory 110 is memory array 112, which consists of flash memory cells, each capable of storing one bit of data, arranges in rows and columns. In the conventional manner, all of the cells in one row are energized for a memory operation (either a read or a program) by a word line WL uniquely associated with that row. A memory operation cannot be performed unless the word line associated with the target row of cells is activated.

The memory array 112 may be organized in sectors, each sector consisting of a plurality of rows of memory cells. During an erase operation, the memory cells in a selected sector are simultaneously erased.

At least a subset of the cells in a row (typically all of the cells that store data for one memory word) can be accessed simultaneously for a given memory operation via bit lines $BL_O$–$BL_K$. When the memory operation is a read, bit lines $BL_O$–$BL_K$ are coupled to sense amplifiers in the column I/O 120 that "sense" the data stored in the corresponding cells of the row whose word line WL is enabled. When the memory operation is a program operation, the bit lines $BL_O$–$BL_K$ carry the signals used to program the corresponding cells of the row associated with the enabled word line.

Control circuit 116 controls the other blocks of memory 110 when a chip enable signal 101 enables operation of the memory. Depending on the operation to be performed, the control circuit issues the appropriate control signals 117a and 117b to row decoder 114 and I/O data circuit 118, respectively.

Regardless of whether the memory operation is a read or program, row decoder 114 decodes the address signals $A_O$–$A_N$ and activates the word line WL of the row that includes the memory word that is the target of the current memory operation. If the operation is a program, I/O data circuitry 118 buffers input data signals $I/O_O$–$I/O_K$ and outputs the buffered data to column I/O 120 via bi-directional data bus 119. Column I/O 120 then latches the input signals in parallel onto the corresponding bit lines $BL_O$–$BL_K$. The signals on the bit lines $BL_O$–$BL_K$ are used to program the cells composing the word whose word line was activated for the current operation by row decoder 114.

If the operation is a read, sense amplifiers in column I/O 120 sense the signals on the respective bit lines $BL_O$–$BL_K$, convert the sensed signals into binary (e.g., high or low) voltages that represent the programmed state of the addressed word and output the word's bit values to the I/O data circuit via bi-directional bus 119. The output data are buffered by I/O data circuit 118 and latched onto bi-directional data lines $I/O_O$–$I/O_K$ for use by controller 122.

For proper operation of the memory cells in flash memory 110, row decoder 114 must provide the enabled word line WL with a voltage appropriate for the selected read, program or erase operation. For example, for conventional flash memory cells the enabled word line WL must typically reach a voltage of 4–5 volts (V) during a read operation to provide the memory cells with a sufficient read operation margin. The memory cells of some other types of nonvolatile memories, such as EPROMs, typically have similar word line voltage requirements.

Memory 110 may use a low-voltage power supply ($V_{cc}$) of less than 4–5 V. Such low-voltage power supply memories, in which $V_{cc}$ may be as low as about 1.8 V, are increasing in popularity as battery-powered applications become more widespread. In these memories, a voltage higher than $V_{cc}$ is necessary to drive the word lines to the required 4–5 V.

One technique used to drive the word lines to the required higher-than-Vcc voltage couples a bootstrap circuit to one or more inputs of row decoder 114. The bootstrap circuit is a well-known circuit used to generate a signal having a peak voltage higher than $V_{cc}$. The bootstrap circuit outputs a fixed amount of charge via a bootstrap capacitance $C_{boot}$. The voltage produced at the output of the bootstrap circuit is highly dependent on the load presented by the row decoder, decoder load capacitance $C_D$, to the bootstrap circuit. Decoder load capacitance $C_D$ primarily consists of the gate and parasitic capacitances of the transistors in row decoder 114 connected to the bootstrap circuit. If the decoder load capacitance $C_D$ is relatively large compared to the size of the bootstrap capacitance $C_{boot}$, the bootstrap circuit may be unable to generate the voltage necessary to drive the word lines.

To compensate for a relatively large decoder load capacitance $C_D$, the size of the bootstrap capacitance $C_{boot}$ may be increased. However, a large bootstrap capacitance is undesirable for several reasons. First, the large bootstrap capacitance increases the size of the bootstrap circuit. Second, it increases the amount of noise generated by the bootstrap circuit. Third, it increases the power consumed by the bootstrap circuit. Therefore, for a memory 110 having a low-voltage power supply, it is important for row decoder 114 to minimize the decoder load capacitance $C_D$ presented to the bootstrap circuit.

In view of the foregoing, it is an object of the present invention to provide a row decoder for a nonvolatile memory having a low-voltage power supply that minimizes the load capacitance presented to a high voltage source without requiring additional circuitry.

SUMMARY OF THE INVENTION

The present invention is a row decoder for a nonvolatile memory having a low-voltage power supply that minimizes the load capacitance presented to a high voltage source without requiring additional circuitry. The row decoder accomplishes this by providing a local decoder having only one input requiring a boosted voltage ($V_{cc}+$) higher than the power supply voltage.

The row decoder of the present invention comprises a plurality of predecoders, a plurality of global decoders, and a plurality of local decoders. Each local decoder is coupled to one of the plurality of predecoders are one of the plurality of global decoders. Each local decoder includes a single $V_{cc}+$ input for receiving a signal having a peak voltage of $V_{cc}+$. Each local decoder also includes a word line output for generating a word line signal having a peak voltage of about $V_{cc}+$.

In one embodiment of the present invention, the local decoder includes a bootstrapped n-channel transistor that is used to output the word line signal. In this embodiment, the gate of the n-channel transistor is configured to be bootstrapped to a voltage higher than $V_{cc}+$, the drain of the n-channel transistor is coupled to the $V_{cc}+$ input and the source of the n-channel transistor coupled to the word line output.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

Figure 1:
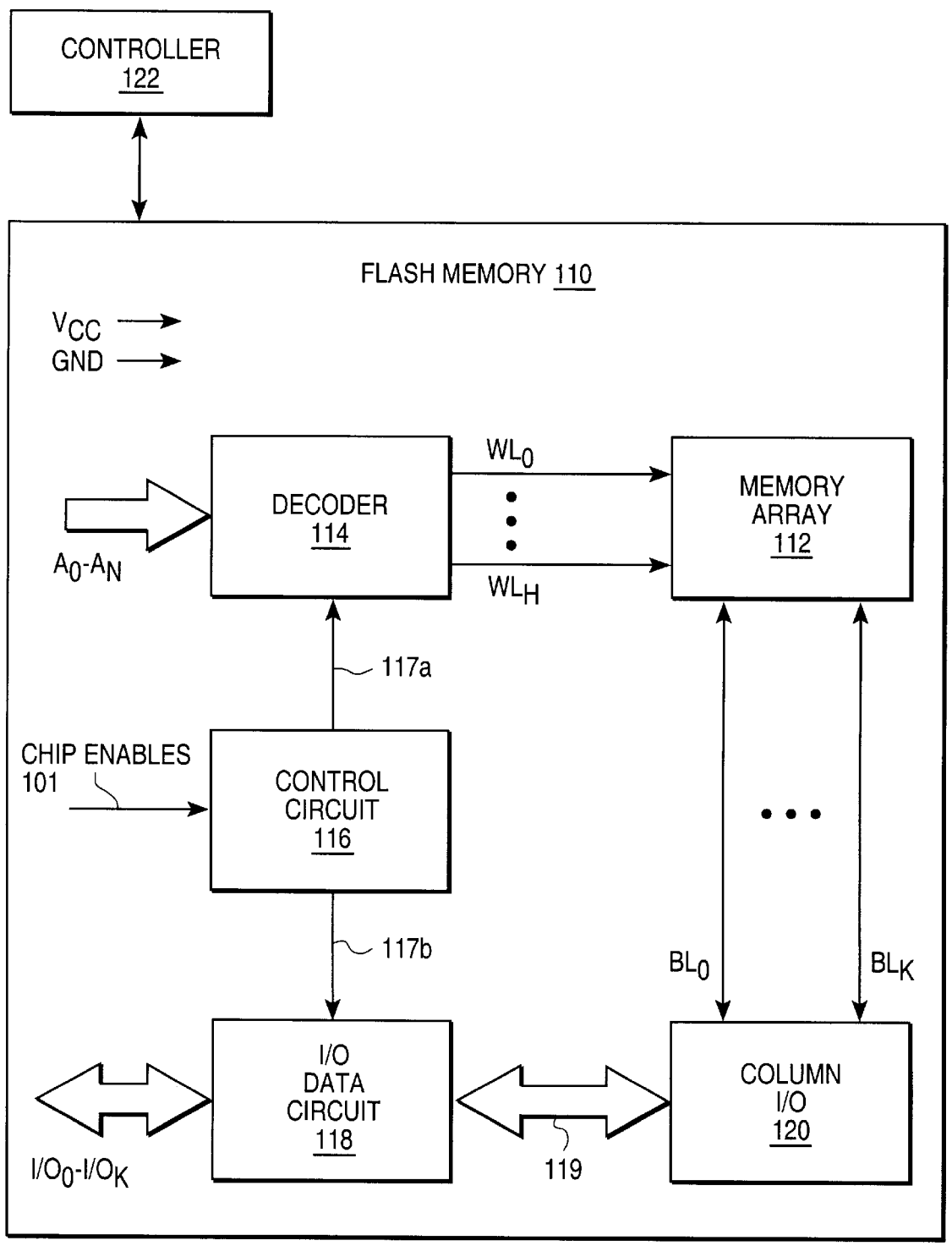
FIG. 1 is a block diagram of a flash memory characteristic of both the prior art and the present invention.
Figure 2:
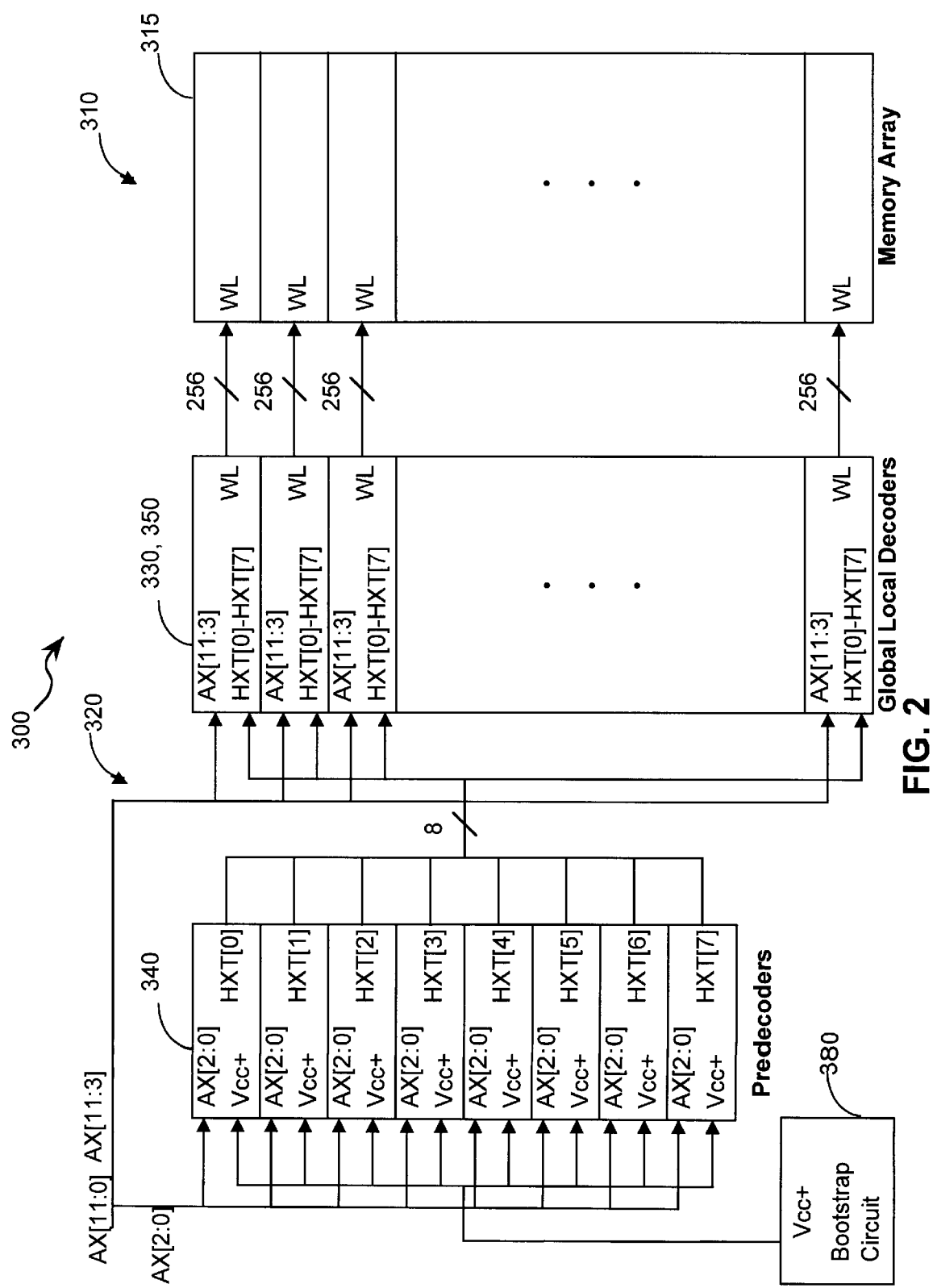
FIG. 2 is a block diagram of a flash memory including a row decoder in accordance with an embodiment of the present invention.

FIG. 2 is a block diagram of a portion of a flash memory 300 in accordance with an embodiment of the present invention. Memory 300 is a similarly in many respects to the memory described in the background section and therefore, only aspects of the memory particularly pertinent to the present invention will be described herein.

In this embodiment, memory 300 is an 8 megabit (Mb) flash memory having a power supply voltage ($V_{cc}$) of 1.8 V. In other embodiments, memory 300 may be another type of nonvolatile memory, such as an EPROM, or may have a different storage capacity or $V_{cc}$.

Referring to FIG. 2, memory 300 includes a memory array 310 having 4096 rows and 2048 columns. Each row of memory array 310 includes a corresponding word line WL connected to a plurality of memory cells (not shown) in the row. Memory array 310 is organized into 16 sectors 315, each sector containing 256 rows. Each sector 315 is further divided into 32 subsectors (not shown), each subsector containing eight rows. Consequently, memory array 310 contains 512 subsectors.

Continuing to refer to FIG. 2, memory 300 also includes a row decoder 320 connected to memory array 310. Row decoder 320 decodes a 12 bit row address AX[11:0] to select one of the 4096 rows in memory array 310 for access. Row decoder 320 includes eight predecoders 340 to select one of the eight rows in each of the 512 subsectors for access. Row decoder 320 also includes 512 global decoders 330 to select one of the 512 subsectors in memory array 310 for access. Row decoder 320 further includes 4096 local decoders 350 that decode the output of predecoders 340 and global decoders 330 to select one of the 4096 rows or word lines WL in memory array 310 for access.

For a read operation, the memory cells in memory array 310 require a word line voltage of 4–5 V. This word line voltage is required to provide the memory cells in the selected row with a sufficient read operation margin. Since memory 300 is provided with a $V_{cc}$ of only 1.8 V, local decoders 350 must be capable of generating a voltage ($V_{cc}+$) significantly higher than $V_{cc}$ to provide the selected word line with the required 4–5 V. This higher-than-$V_{cc}$ voltage is supplied by a bootstrap circuit 380 coupled to row decoder 320.

Figure 3:
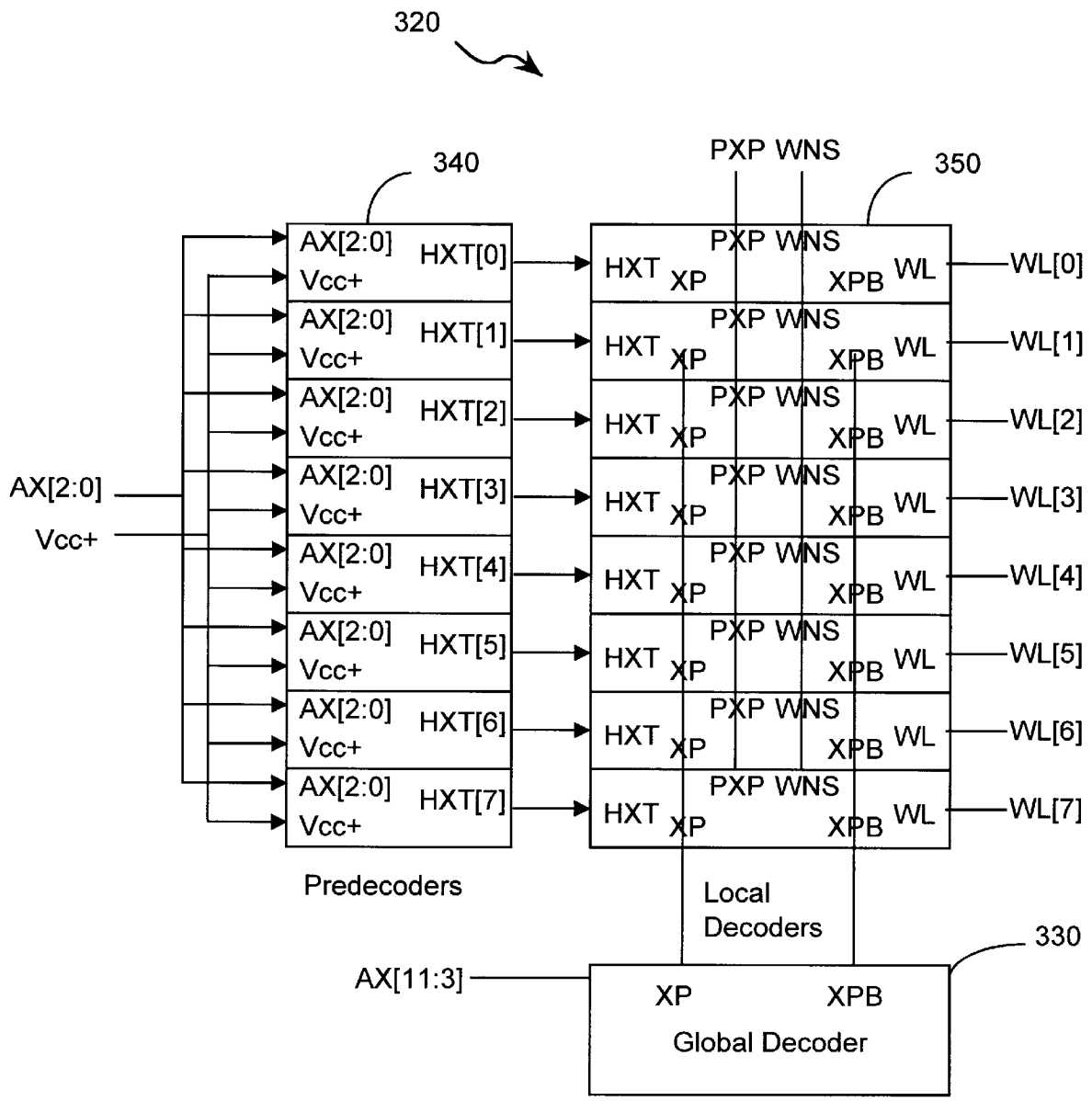
FIG. 3 is a block diagram of a portion of the row decoder shown in FIG. 2 associated with a single subsector.

FIG. 3 shows a block diagram of a portion of row decoder 320 associated with one of the 512 subsectors in memory array 310. Eight predecoders 340 are provided for the eight rows in the subsector. Each of the eight predecoders 340 is shared among the corresponding rows in all 512 subsectors of memory array 310. For example, the predecoder 340 associated with the first of the eight rows of the subsector is shared among the first rows of all 512 subsectors in the memory array. Each predecoder 340 receives the lower address bits AX[2:0] of the memory address to select one of the eight rows in the subsector. Each predecoder 340 outputs a select signal HXT[i], where i is a value between 0 and 7, that is received by the respective local decoder 350. As mentioned earlier, one of the eight rows in every subsector is selected for access by predecoders 340. For the predecoder 340 associated with the one selected row in the subsector, the HXT[i] signal is driven to a voltage ($V_{cc}+$) higher than $V_{cc}$. This higher-than-$V_{cc}$ voltage is supplied by bootstrap circuit 380 connected to a $V_{cc}+$ input of each predecoder 340, as explained in greater detail below. For the predecoders associated with the seven unselected rows in the subsector, HXT[i] is set to 0 V.

Also referring to FIG. 3, one global decoder 330 is provided for the subsector. Global decoder 330 receives the upper address bits AX[11:3] of the memory address to select one of the 512 subsectors for access. Global decoder 330 outputs a global word line signal XP and its complement, XPB, that are received by all eight local decoders 350 in the subsector. As mentioned earlier, one of the 512 subsectors in memory 300 is selected for access. For the global decoder 330 associated with the one selected subsector, the XP and XPB signals are driven to $V_{cc}$ and 0 V, respectively. For the global decoders associated with the 511 unselected subsectors, the XP and XPB signals are driven to 0 V and $V_{cc}$, respectively.

Continuing to refer to FIG. 3, eight local decoders 350 are provided for the eight rows in the subsector. Each local decoder 350 receives the HXT[i] signal from the corresponding predecoder 340. Each HXT[i] signal indicates to the corresponding local decoder 350 whether the corresponding row in the subsector is selected. Each local decoder 350 also receives the XP and XPB signals from global decoder 330. The XP and XPB signals indicate to local decoders 350 whether the subsector is selected. The 4096 local decoders 350 in row decoder 320 decode these signals to select the one row in memory array 310 that corresponds to both the selected row and the selected subsector. Each local decoder in the subsector outputs a local word line signal WL[i], where i is a value between 0 and 7, that is coupled to the word line WL of the corresponding row in the subsector. For the local decoder 350 associated with the both the selected subsector and the selected row, the WL[i] signal is driven to $V_{cc}+$. For all other local decoders, WL[i] is set to 0 V.

Still referring to FIG. 3, each local decoder 350 also receives a PXP signal and a WNS signal. The PXP signal, which is shared by all local decoders 350 in memory 300, is set to $V_{cc}$. The WNS signal, which is shared by all local decoders 350 in the same sector 315, is normally set to 0 V. During an erase operation, however, the WNS signal for the sector to be erased is driven to −10 V.

Figure 4:
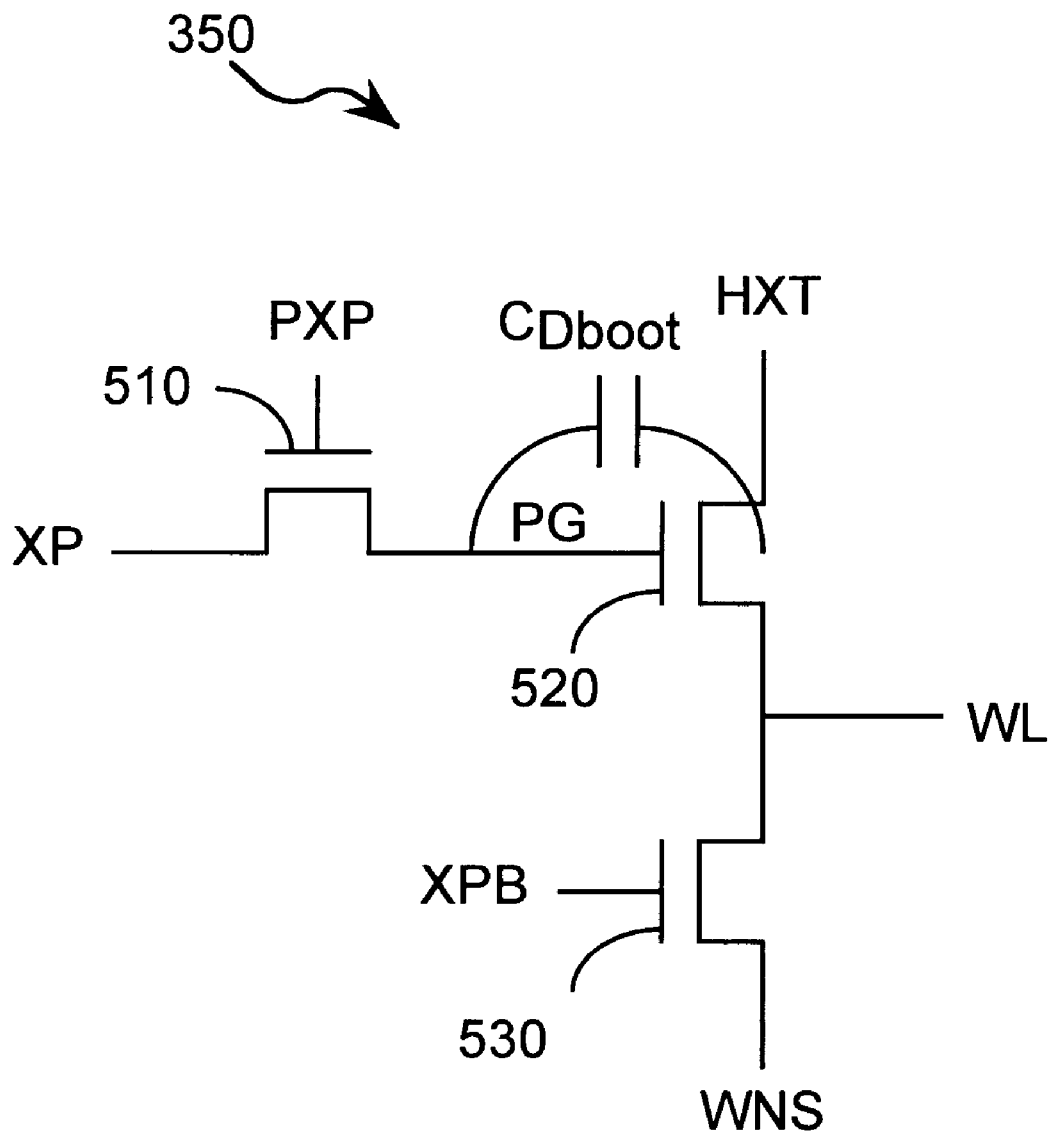
FIG. 4 is a circuit diagram of a local decoder of the row decoder shown in FIGS. 2 and 3.

FIG. 4 is a circuit diagram of local decoder 350 in row decoder 320. Local decoder 350 includes inputs XP and XPB for receiving the XP and XPB signals, respectively, output by the associated global decoder 330 (shown in FIG. 3). Local decoder 350 also includes an HXT input for receiving the HXT[i] signal output by the corresponding predecoder 340 (shown in FIG. 3). In addition, local decoder 350 includes PXP and WNS inputs for receiving the corresponding PXP and WNS signals. For a read operation, the PXP and WNS inputs are held constant at $V_{cc}$ and 0 V, respectively. Local decoder 350 further includes an output WL for coupling to the corresponding word line WL of memory array 310.

Only one of the inputs of local decoder 350 (HXT) is driven to a voltage ($V_{cc}+$) of higher than $V_{cc}$. The other inputs of local decoder 350 (XP, XPB, PXP, and WNS) are driven to either $V_{cc}$ or 0 V. Because of this, only one input of local decoder 350 is connected to bootstrap circuit 380. As a result, the decoder load capacitance $C_D$ presented to bootstrap circuit 380 is minimized, as explained in greater detail below. Referring to FIG. 4, local decoder 350 comprises three n-channel MOS transistors 510, 520 and 530, each transistor having a gate, source and drain. Unlike some prior art local decoders, no p-channel transistors are used in local decoder 350. The absence of p-channel transistors in local decoder 350 provides two important advantages. First, it reduces the number of inputs that need to be driven to $V_{cc}+$ in the local decoder, thereby reducing the decoder load capacitance $C_D$. As just mentioned, local decoder 350 has only one $V_{cc}+$ input. By contrast, a local decoder using a p-channel transistor to transmit a $V_{cc}+$ voltage requires the $V_{cc}+$ voltage to also be applied to the p-channel transistor's gate to turn the transistor off. Consequently, the local decoder requires an additional $V_{cc}+$ input to control the p-channel transistor's gate. Second, the absence of p-channel transistors reduces the size of the local decoder. This is because the spacing required between n-channel transistors is smaller than the spacing required between an n-channel transistor and a p-channel transistor.

Continuing to refer to FIG. 4, the connections of transistor 510 of local decoder 350 are now described. The gate of transistor 510 is connected to the PXP input, which is held at $V_{cc}$ during a read operation. The drain and source of transistor 510 are connected to the XP input and the gate of transistor 520, respectively. As a consequence, transistor 510 couples the XP input to the gate of transistor 520.

Further referring to FIG. 4, the gate of transistor 520 is connected to the drain of transistor 510, coupling the XP input to transistor 520's gate. The drain and source of transistor 520 are connected to the HXT input and WL output, respectively. As a consequence, transistor 520 transmits the HXT signal to the corresponding word line WL when the XP signal is asserted; this occurs when the subsector associated with local decoder 350 is selected.

Also referring to FIG. 4, transistor 520 includes a decoder bootstrap capacitance $C_{Dboot}$ formed between the gate and channel of the transistor. The bootstrap capacitance $C_{Dboot}$ is the capacitance developed across the gate oxide of transistor 520 when the transistor is in its conducting state. As will be described in greater detail below, the bootstrap capacitance $C_{Dboot}$ "bootstraps" the gate of transistor 520 (node PG) to a voltage higher than $V_{cc}+$ such that the transistor can transmit a higher-than-$V_{cc}+$ voltage signal between its source and drain without incurring a threshold voltage ($V_t$) voltage drop.

Still referring to FIG. 4, the connections of transistor 530 of local decoder 350 are now described. The gate of transistor 530 is connected to the XPB input. The drain and the source of transistor 530 are connected to the WL output and WNS input, respectively. The WNS input is held at 0 V during a read operation. As a consequence, transistor 530 holds the WL output to 0 V when the XPB signal is set to $V_{cc}$; this occurs when the subsector associated with local decoder 350 is unselected.

Table 1 illustrates the function realized by local decoder 350. The table shows the voltage at output WL for all combinations of voltages for inputs XP, XPB and HXT during a read operation. When XP and XPB and 0 V and $V_{cc}$, respectively, WL is 0 V, irrespective of the voltage of HXT. This occurs when the subsector associated with local decoder 350 is unselected. When XP and XPB are $V_{cc}$ and 0 V, respectively, WL has a voltage equal to HXT. This condition occurs when the subsector associated with local decoder 350 is selected. Therefore, WL has a voltage of $V_{cc}+$ only when XP/XPB has a value of $V_{cc}/0$ V and HXT has a value of $V_{cc}+$. This condition occurs only when both the subsector and row associated with local decoder 350 are selected.

TABLE 1

| XP/XPB | HXT | WL |
|---|---|---|
| 0 V/$V_{cc}$ | 0 V | 0 V |
| 0 V/$V_{cc}$ | $V_{cc}+$ | 0 V |
| $V_{cc}$/0 V | 0 V | 0 V |
| $V_{cc}$/0 V | $V_{cc}+$ | $V_{cc}+$ |

Figure 5:
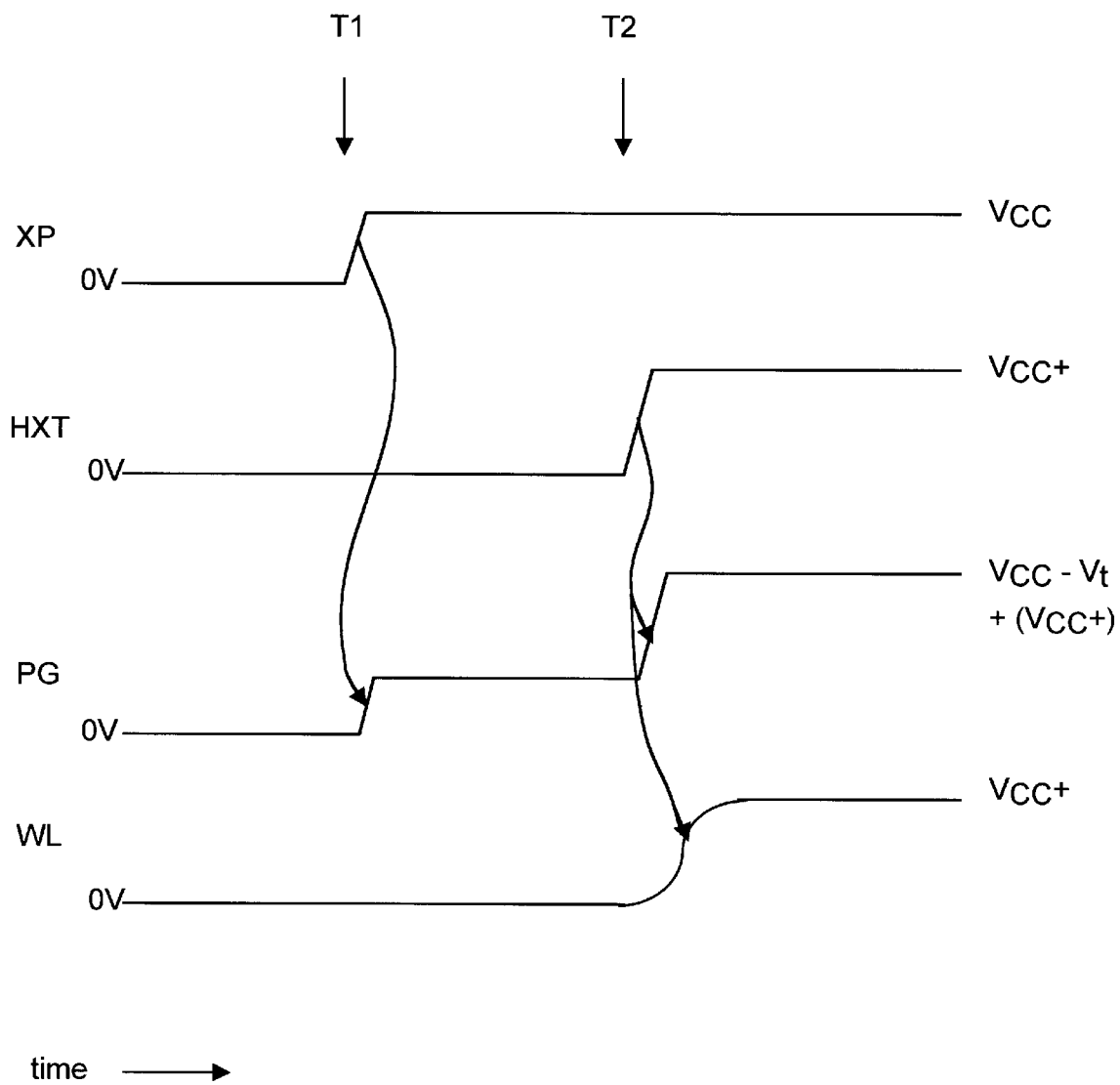
FIG. 5 is a timing diagram for the local decoder shown in FIG. 4 during a read operation.

Referring to FIGS. 4 and 5, the operation of local decoder 350 will now be described for a read operation when the subsector associated with the local decoder is selected. At a setup time T1, the XP and XPB inputs of the local decoder are driven to $V_{cc}$ and 0 V, respectively, by global decoder 330. With the gate and drain of transistor 510 now at $V_{cc}$, node PG is precharged to $V_{cc}-V_t$ at which point transistor 510 shuts off (i.e., nonconducting). In other implementations, node PG may have a voltage higher than $V_{cc}-V_t$ if the PXP input is bootstrapped at this time. Transistor 520, with its gate at $V_{cc}-V_t$, turns on. Transistor 530, however, with its gate at 0 V, is shut off.

Continuing to refer to FIGS. 4 and 5, at a later time T2, the HXT input of the local decoder 350 associated with the selected word line WL in the selected subsector is driven from 0 V to $V_{cc}+$ by predecoder 340. This higher-than-$V_{cc}$ voltage is provided to predecoder 340 by bootstrap circuit 380, as explained in greater detail below. In response to the HXT input transition, decoder bootstrap capacitance $C_{Dboot}$ "bootstraps" the PG node to a voltage higher than its present value of $V_{cc}-V_t$, as will now be explained. The voltage V across a capacitor is determined by the equation V=Q/C, where Q is the charge stored in the capacitor and C is the capacitance of the capacitor. Since the charge Q and capacitance C of the capacitor remain essentially constant under non-DC conditions, the voltage V across the capacitor also remains nearly constant. As a result, a change in the voltage of one side of the capacitor causes the other side to change by the same amount. Therefore, the HXT input transition from 0 V to $V_{cc}+$ causes the voltage of the PG node to rise from $V_{cc}-V_t$ to approximately $V_{cc}-V_t+(V_{cc}+)$. This assumes that the parasitic capacitance of transistor 510 is much smaller than the bootstrap capacitance $C_{Dboot}$. The PG node remains at this elevated voltage since transistor 510 now off. With node PG now at about $V_{cc}-V_t+(V_{cc}+)$, transistor 520 transmits the full $V_{cc}+$ voltage of the HXT signal to the WL output. Consequently, the selected word line WL in the selected subsector is driven by local decoder 350 to $V_{cc}+$.

As just seen, the bootstrapping technique used by local decoder 350 enables n-channel transistor 520 to transmit a $V_{cc}+$ voltage between its drain and source without incurring the $V_t$ voltage drop characteristic of n-channel transistors. The use of bootstrapping thus enables local decoder 350 to output a $V_{cc}+$ voltage without using any p-channel transistors.

Still referring to FIGS. 4 and 5, at time T2, the HXT inputs of the local decoders 350 corresponding to the unselected word lines WL[i] in the selected subsector are set at 0 V. Consequently, node PG remains at $V_{cc}-V_t$. With node PG at $V_{cc}-V_t$, transistor 520 transmits the 0 V HXT signal to the WL output. As a result, the unselected word lines WL in the selected subsector are set to 0 V.

Now, the operation of local decoder 350 will be described for when the subsector associated with the local decoder is unselected. At setup time T1, the XP and XPB inputs of the local decoder are driven to 0 V and $V_{cc}$, respectively, by global decoder 330. With the gate and drain of transistor 510 now at $V_{cc}$ and 0 V, respectively, node PG is set to 0 V at which point transistor 510 remains on (i.e., conducting). Transistor 520, with its gate at 0 V, is turned off. Transistor 530, however, with its gate at $V_{cc}$, is turned on. Consequently, transistor 530 transmits the WNS signal, which is set at 0 V, to the WL output.

At time T2, the HXT input may transition to $V_{cc}+$ if local decoder 350 corresponds to the selected word line. Unlike the case in which the subsector is selected, however, the HXT input transition does not cause decoder bootstrap capacitance $C_{Dboot}$ to bootstrap the PG node because transistor 520 is not conducting. Consequently, the PG node remains at 0 V and transistor 520 remains off. As a result, the word lines WL in the unselected subsectors of memory array 310 are set to 0 V.

As mentioned earlier in the background section, row decoder 320 presents a decoder load capacitance $C_D$ to the output of bootstrap circuit 380. The decoder load capacitance $C_D$ of decoder 320 is calculated as follows. Referring to FIG. 2, the output of bootstrap circuit 380 is connected to the $V_{cc}+$ input of each of the eight predecoders 340 in row decoder 320. Therefore, the capacitance presented to bootstrap circuit 380 by the eight predecoders 340 is $8 \times C_p$, where $C_p$ is the capacitance of the predecoder 340.

Continuing to refer to FIG. 2, bootstrap circuit 380 is also coupled to 512 local decoders 350 through one of the eight predecoders 340. As indicated earlier, only one of the eight predecoders 340 corresponding to the selected row in the subsector produces a $V_{cc}+$ voltage at its HXT[i] output at any given time. As a consequence, the one predecoder outputting the $V_{cc}+$ voltage couples the 512 local decoders 350 connected to that predecoder to bootstrap circuit 380. The seven other predecoders decouple the remaining 3584 local decoders in row decoder 320 from the bootstrap circuit since they do not supply a $V_{cc}+$ voltage to the local decoders. Therefore, the capacitance presented to bootstrap circuit 380 by local decoders 350 is $512 \times C_{LD}$, where $C_{LD}$ is the capacitance of the local decoder 350.

Still referring to FIG. 2, bootstrap circuit 380 is additionally coupled to a single enable word line WL in memory array 310. As mentioned earlier, the word line WL corresponding to both the selected subsector and selected row is driven to $V_{cc}+$. To supply this voltage, bootstrap circuit 380 is coupled to the enabled word line WL. Enabled word line WL presents a capacitance $C_{WL}$ to bootstrap circuit 380.

The total decoder load capacitance $C_D$ presented by row decoder 320 to bootstrap circuit 380 can therefore be expressed as:

$$C_D = 8C_p + 512C_{LD} + C_{WL}$$

where $C_p$ is the capacitance presented by predecoder 340, $C_{LD}$ is the capacitance presented by local decoder 350, and $C_{WL}$ is the capacitance presented by word line WL.

As seen from the above equation, the local decoder capacitance $C_{LD}$ comprises a significant portion of the decoder load capacitance $C_D$ presented to the bootstrap circuit. However, as described earlier, local decoder 350 minimizes the capacitance $C_{LD}$ by requiring only a single input (HXT) to be provided with a $V_{cc}+$ voltage. Since the HXT input of local decoder 350 is connected to the drain of transistor 520 (as shown in FIG. 4), the local decoder capacitance $C_{LD}$ is the drain capacitance $C_d$ of transistor 520, which is very small.

For one embodiment of the present invention, the decoder load capacitance $C_D$ presented by row decoder 320 is well below 10 pF. Consequently, the bootstrap capacitance $C_{boot}$ of the bootstrap circuit 380 used to drive the row decoder may be relatively small.

In an alternative embodiment of the present invention, memory 300 may include a larger number of rows per subsector than the first embodiment, e.g., 16 rows rather than 8 rows. In this embodiment, the number of predecoders 340 in row decoder 320 is correspondingly increased to match the larger number of rows per subsector. This embodiment further reduces the decoder load capacitance $C_D$ as compared with the first embodiment, as seen from the following equation:

$$C_D = 16C_p + 256C_{LD} + C_{WL}$$

In summary, the present invention is a low-voltage power supply row decoder for a nonvolatile memory that minimizes the decoder load capacitance $C_D$ presented to the bootstrap circuit without requiring additional circuitry. Row decoder 320 accomplishes this by providing a local decoder 350 having only one input requiring a $V_{cc}$+ voltage. Consequently, row decoder 320 can generates the required 4–5 V word line voltage using a bootstrap circuit 380 having a relatively small bootstrap capacitance $C_{boot}$.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A decoder circuit for a nonvolatile memory configured to receive a $V_{cc}$+ signal having a peak voltage ($V_{cc}$+) higher than the power supply voltage ($V_{cc}$), the decoder circuit comprising:

a $V_{cc}$+ voltage source for generating a $V_{cc}$+ signal having a peak voltage higher than $V_{cc}$;

a plurality of predecoders, each predecoder having a $V_{cc}$+ input for receiving the $V_{cc}$+ signal from the $V_{cc}$+ voltage source and an output for generating a predecoded $V_{cc}$+ signal having a peak voltage of about $V_{cc}$+;

a plurality of global decoders; and a plurality of local decoders, wherein each local decoder is coupled to one of the plurality of predecoders and one of the plurality of global decoders and includes a single $V_{cc}$+ input for receiving the predecoded $V_{cc}$+ signal from the corresponding predecoder and a word line output for generating a word line signal having a peak voltage of about $V_{cc}$+.

2. The decoder circuit of claim 1, wherein each local decoder includes a bootstrapped n-channel transistor, the gate of the n-channel transistor configured to be bootstrapped to a voltage higher than $V_{cc}$+, the drain of the n-channel transistor coupled to the $V_{cc}$+ input and the source of the n-channel transistor coupled to the $V_{cc}$+ input and the source of the n-channel transistor coupled to the word line output.

3. The decoder circuit of claim 1, wherein:

each global decoder generates a first and a second select signal; and each local decoder comprises a first, a second and a third n-channel transistor, each transistor having a gate, a drain and a source, the gate of the first n-channel transistor coupled to a first circuit that generates a voltage greater than or equal to $V_{cc}$, the drain of the first n-channel transistor coupled to the corresponding global decoder to receive the first selected signal, the source of the first n-channel transistor coupled to the gate of the second n-channel transistor, the drain of the second n-channel transistor coupled to the $V_{cc}$+ input, the source of the second n-channel transistor coupled to the word line output, the gate of the third n-channel transistor coupled to the corresponding global decoder to receive the second select signal, the drawing of the third n-channel transistor coupled to the word line output, and the source of the third n-channel transistor coupled to a second circuit that generates a voltage of about 0 volts.

4. A nonvolatile memory configured to receive a power supply voltage ($V_{cc}$), comprising:

(a) a $V_{cc}$+ voltage source for generating a $V_{cc}$+ signal having a peak voltage higher than $V_{cc}$;

(b) a decoder circuit coupled to the $V_{cc}$+ voltage source and comprising a plurality of predecoders, a plurality of global decoders and a plurality of local decoders, wherein:

each predecoder has a $V_{cc}$+ input for receiving the $V_{cc}$+ signal from the $V_{cc}$+ voltage source and an output for generating a predecoder $V_{cc}$+ signal having a peak voltage of about $V_{cc}$+;

each local decoder is coupled to one of the plurality of predecoders and one of the plurality of global decoders; and each local decoder includes a single $V_{cc}$+ input for receiving the predecoded $V_{cc}$+ signal from the corresponding predecoder and a word line output for generating a word line signal having a peak voltage of about $V_{cc}$+; and (c) an array of memory cells coupled to the decoder.

5. The memory of claim 4, wherein each local decoder includes a bootstrapped n-channel transistor, the gate of the n-channel transistor configured to be bootstrapped to a voltage higher than $V_{cc}$+, the drain of the n-channel transistor coupled to the $V_{cc}$+ input and the source of the n-channel transistor coupled to the word line output.

* * * * *